(12) United States Patent
Kaida et al.

(10) Patent No.: US 10,715,104 B2
(45) Date of Patent: Jul. 14, 2020

(54) PIEZOELECTRIC VIBRATION COMPONENT AND METHOD FOR MANUFACTURING THE SAME

(71) Applicant: Murata Manufacturing Co., Ltd., Nagaokakyo-shi, Kyoto-fu (JP)

(72) Inventors: Hiroaki Kaida, Nagaokakyo (JP); Kazuyuki Noto, Nagaokakyo (JP); Keiichi Kami, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 458 days.

(21) Appl. No.: 15/623,606

(22) Filed: Jun. 15, 2017

(65) Prior Publication Data

US 2017/0288637 A1 Oct. 5, 2017

Related U.S. Application Data

(63) Continuation of application No. PCT/JP2015/075309, filed on Sep. 7, 2015.

(30) Foreign Application Priority Data

Jan. 8, 2015 (JP) .................. 2015-002485

(51) Int. Cl.
*H03H 9/10* (2006.01)
*H03H 3/02* (2006.01)
*H01L 41/053* (2006.01)
*H01L 23/02* (2006.01)
*H03H 9/17* (2006.01)

(52) U.S. Cl.
CPC .............. *H03H 9/10* (2013.01); *H01L 23/02* (2013.01); *H01L 41/0533* (2013.01); *H03H 3/02* (2013.01); *H03H 9/1021* (2013.01); *H03H 9/17* (2013.01); *H01L 2924/0002* (2013.01); *H03H 2003/022* (2013.01)

(58) Field of Classification Search
CPC ..... H01L 41/053; H01L 41/0533; H03H 9/10; H03H 9/1021; H03H 9/17
USPC ......................................... 310/348
See application file for complete search history.

(56) References Cited

U.S. PATENT DOCUMENTS 9,406,868 B2   8/2016   Kohda et al.
2002/0005684 A1  1/2002  Sawai et al.
(Continued)

FOREIGN PATENT DOCUMENTS

CN   1274992 A   4/2016
JP   2002-176116 A   6/2002
(Continued)

OTHER PUBLICATIONS

International Search Report issued in International Application No. PCT/JP2015/075309, dated Oct. 6, 2015.
(Continued)

*Primary Examiner* — Derek J Rosenau
(74) *Attorney, Agent, or Firm* — Arent Fox LLP

(57) ABSTRACT

A piezoelectric vibration component that includes a substrate having a principal surface and a side face, a piezoelectric vibrator, a lid, and an adhesive layer that hermetically seals the piezoelectric vibrator in a space between the lid and the principal surface. The adhesive layer extends from the principal surface to at least a portion of the side face of the substrate.

16 Claims, 3 Drawing Sheets

(56) References Cited

U.S. PATENT DOCUMENTS

| | | | |
|---|---|---|---|
| 2011/0215678 A1 | 9/2011 | Kohda et al. | |
| 2013/0049543 A1* | 2/2013 | Amano | H03H 9/171 |
| | | | 310/344 |
| 2013/0241358 A1* | 9/2013 | Mizusawa | H03H 9/1021 |
| | | | 310/348 |
| 2014/0047687 A1 | 2/2014 | Kohda et al. | |
| 2014/0291011 A1* | 10/2014 | Yoshimatsu | H01L 41/23 |
| | | | 174/521 |
| 2014/0292143 A1 | 10/2014 | Ichikawa | |

FOREIGN PATENT DOCUMENTS

| | | |
|---|---|---|
| JP | 2012-074937 A | 4/2012 |
| JP | 2013-192052 A | 9/2013 |
| JP | 2014183359 A | 9/2014 |
| JP | 2014-197615 A | 10/2014 |
| JP | 2014197617 A | 10/2016 |
| WO | WO 2010/074127 A1 | 7/2010 |

OTHER PUBLICATIONS

Written Opinion of the International Searching Authority issued in International Application No. PCT/JP2015/075309, dated Oct. 6, 2015.

* cited by examiner

PIEZOELECTRIC VIBRATION COMPONENT AND METHOD FOR MANUFACTURING THE SAME

CROSS REFERENCE TO RELATED APPLICATIONS

The present application is a continuation of International application No. PCT/JP2015/075309, filed Sep. 7, 2015, which claims priority to Japanese Patent Application No. 2015-002485, filed Jan. 8, 2015, the entire contents of each of which are incorporated herein by reference.

FIELD OF THE INVENTION

The present invention relates to a piezoelectric vibration component and a method for manufacturing the same.

BACKGROUND OF THE INVENTION

Piezoelectric vibrators are widely used as oscillators or band-pass filters. As a conventional piezoelectric vibrator, for example, Japanese Unexamined Patent Application Publication No. 2014-197615 describes a surface-mount crystal unit having a structure that hermetically seals off a crystal element from the outside air. The surface-mount crystal unit described in this document includes a substrate having the crystal element mounted thereon, and a lid configured to hermetically seal the crystal element by means of an adhesive (see, paragraph [0002] in Japanese Unexamined Patent Application Publication No. 2014-197615).

SUMMARY OF THE INVENTION

If the bonding strength between the substrate and the adhesive is insufficient, the lid may peel off the substrate. In particular, when a thermosetting adhesive is used for bonding the lid and the substrate together to hermetically seal the crystal element, pressure inside the lid increases at a reflow heating temperature of around 260° C. and this may cause the lid to peel off the substrate.

The present invention has been made in view of the circumstances described above. An object of the present invention is to enhance an adhesive force between a substrate and an adhesive layer for hermetically sealing a piezoelectric vibrator on the substrate.

A piezoelectric vibration component according to an aspect of the present invention includes a substrate having a principal surface and a side face, a piezoelectric vibrator, a lid, and an adhesive layer that bonds the substrate and the lid together to hermetically seal the piezoelectric vibrator in a space between the lid and the principal surface. The adhesive layer extends from the principal surface to at least a portion of the side face of the substrate.

Such a structure can enhance an adhesive force between a substrate and an adhesive layer for hermetically sealing a piezoelectric vibrator on the substrate.

DETAILED DESCRIPTION OF THE PREFERRED EMBODIMENTS

Embodiments of the present invention will now be described with reference to the drawings.

Figure 1:
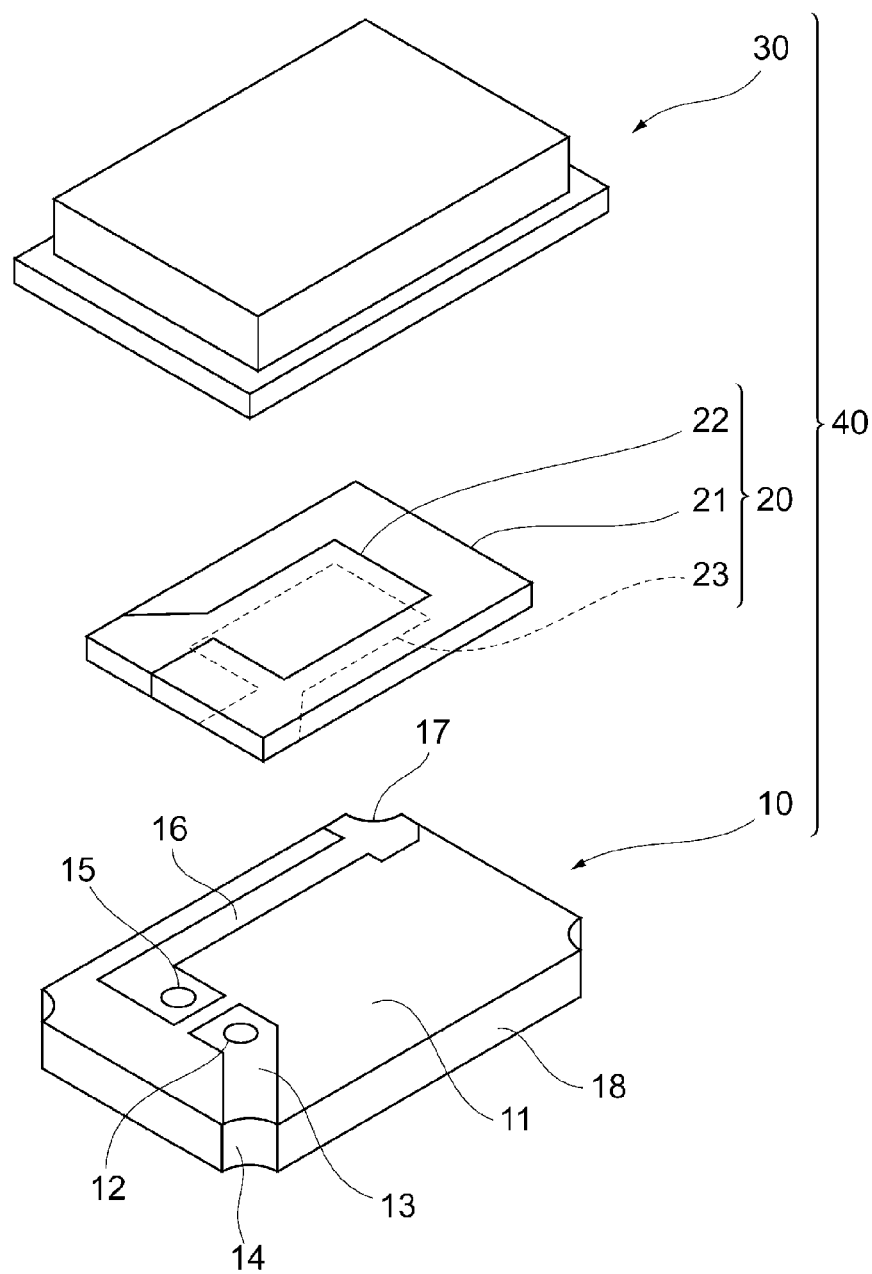
FIG. 1 is an exploded perspective view of a piezoelectric vibration component according to an embodiment of the present invention.

FIG. 1 is an exploded perspective view of a piezoelectric vibration component 40 according to an embodiment of the present invention. As illustrated in FIG. 1, the piezoelectric vibration component 40 mainly includes a piezoelectric vibrator 20, a substrate 10 having a principal surface 11 on which the piezoelectric vibrator 20 is to be mounted, and a lid 30 for hermetically sealing off the piezoelectric vibrator 20 from the outside air. The piezoelectric vibrator 20 includes a flat piezoelectric plate 21 having two surfaces opposite each other in the thickness direction, an excitation electrode 22 formed on one surface of the piezoelectric plate 21, and an excitation electrode 23 formed on the other surface of the piezoelectric plate 21. When an alternating voltage is applied to the excitation electrodes 22 and 23, the piezoelectric plate 21 vibrates in a thickness shear mode. The piezoelectric plate 21 is made of a piezoelectric material (e.g., crystal plate or piezoelectric ceramics) which exhibits piezoelectricity. The excitation electrodes 22 and 23 are each formed of a thin conductive film, such as a gold, chromium, nickel, aluminum, or titanium film.

The substrate 10 is a flat plate-like member having two surfaces opposite each other in the thickness direction thereof. Of the two surfaces of the substrate 10, one surface having the piezoelectric vibrator 20 mounted thereon is referred to as the principal surface 11. The principal surface 11 has thereon a wire 13 electrically connected by a conductive adhesive 12 to the excitation electrode 23, and a wire 16 electrically connected by a conductive adhesive 15 to the excitation electrode 22. The substrate 10 is made of a material having an appropriate mechanical strength and electrical insulation properties (e.g., insulating ceramics such as alumina, synthetic resin, or composite material obtained by covering the surface of a metal plate with an insulating layer). The substrate 10 has notched portions 14 and 17 each formed by cutting away part of a corner portion of the substrate 10 in the shape of a curved surface of a cylinder. The wires 13 and 16 can extend through the notched portions 14 and 17, respectively, to the back surface opposite the principal surface 11, and can be connected to an external circuit.

Figure 3:
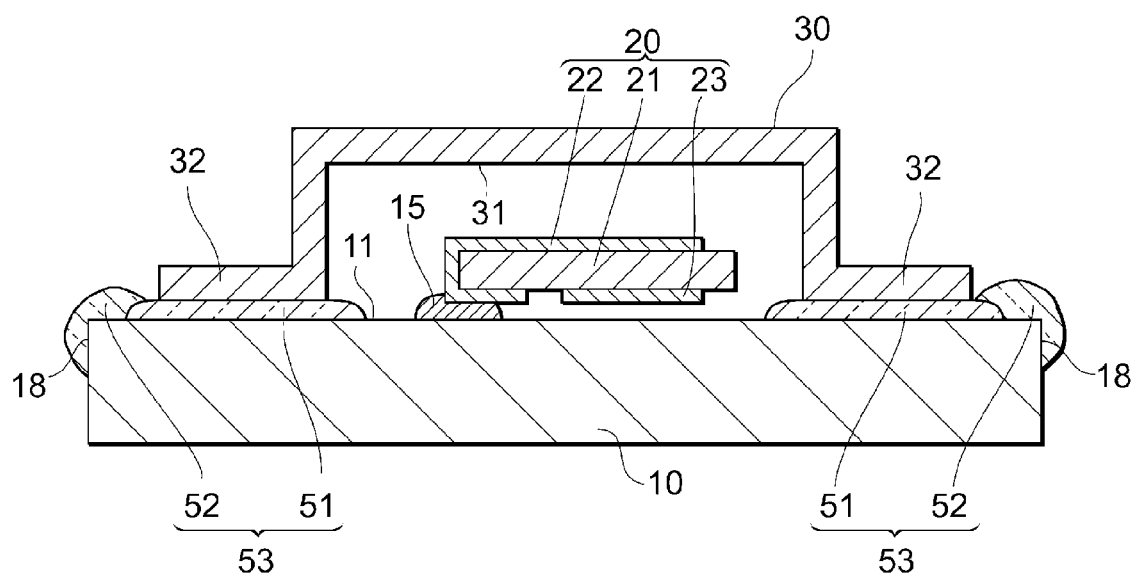
FIG. 3 is another cross-sectional view illustrating the process for manufacturing the piezoelectric vibration component according to the embodiment of the present invention.

The lid 30 is a bottomed cover member for hermetically sealing off the piezoelectric vibrator 20 from the outside air. As illustrated in FIG. 3, the lid 30 has a recessed portion 31 that opens to face the principal surface 11, and a flange portion 32 that protrudes in the direction from the center toward the edge of the opening of the recessed portion 31. The recessed portion 31 has an opening area and depth necessary and sufficient for sealing the piezoelectric vibrator 20. The flange portion 32 surrounds the outer edge of the recessed portion 31 in the shape of a substantially rectangular ring. The lid 30 may be made of a metal material, insulating material, or composite material (e.g., composite material obtained by covering the surface of an insulating member with a thin metal film). Adhesive layers 51 and 52 bond the substrate 10 and the lid 30 together to hermetically seal the piezoelectric vibrator 20 in the space between the recessed portion 31 and the principal surface 11. The adhesive layers 51 and 52 may be of any type, as long as they are insulating adhesive layers. For example, a non-conductive adhesive which is cured by heat treatment and exhibits an adhesive effect may be used to form the adhesive layers 51 and 52. An epoxy-based adhesive primarily composed of epoxy resin may be used as such an adhesive. Examples of the epoxy resin that can be used include bifunctional epoxy resins, such as bisphenol A-type epoxy resin and bisphenol F-type epoxy resin, and novolac-type epoxy resins, such as phenol novolac epoxy resin and cresol novolac epoxy resin. A generally known epoxy resin, such as polyfunctional epoxy resin, glycidyl amine-type epoxy resin, heterocycle-containing epoxy resin, or alicyclic epoxy resin, is also applicable. The adhesive layers 51 and 52 are not limited to epoxy-based adhesive layers and may be, for example, layers of a low-melting glass adhesive. The low-melting glass adhesive may contain lead-free vanadium glass that melts at a temperature of 300° C. to 410° C. The vanadium glass exhibits an adhesive effect by being mixed with a binder and a solvent to form a paste, melted, and then solidified. The vanadium glass is highly reliable in airtightness and resistance to water and moisture when used for bonding. The thermal expansion coefficient of the vanadium glass can be flexibly controlled by controlling the glass structure. The adhesive layers 51 and 52 may be either of the same type or of different types. The lid 30 may also be referred to as a cap, cover, or package member.

Figure 2:
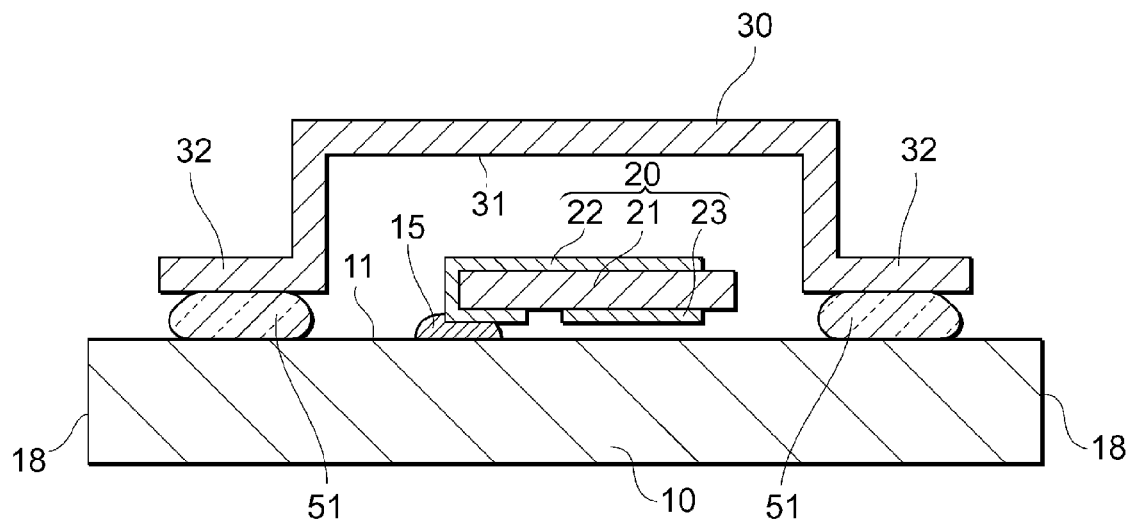
FIG. 2 is a cross-sectional view illustrating a process for manufacturing the piezoelectric vibration component according to the embodiment of the present invention.

A process for manufacturing the piezoelectric vibration component 40 will now be described with reference to FIGS. 1 to 3. First, as illustrated in FIG. 1, the substrate 10 having the piezoelectric vibrator 20 mounted thereon, and the lid 30 for hermetically sealing the piezoelectric vibrator 20 on the substrate 10, are prepared. Next, as illustrated in FIG. 2, the adhesive layer 51 is formed on the principal surface 11 substantially in the shape of a frame to surround the piezoelectric vibrator 20, such that the adhesive layer 51 is aligned with the position where the outer edge of the flange portion 32 is to be bonded to the principal surface 11. To uniformly spread the adhesive layer 51 on the principal surface 11, it is preferable to apply the adhesive layer 51 in a uniform thickness. Next, as illustrated in FIG. 3, the lid 30 and the substrate 10 are relatively pressed against each other to cause the adhesive layer 51 between the principal surface 11 and the flange portion 32 to be pushed out in a fillet form in the direction from the center toward the edge of the opening of the recessed portion 31. At the same time, the adhesive layer 52 is formed to bend along the principal surface 11 and a side face 18 of the substrate 10 in an inverted L-shape in cross-section so as to cover the substrate 10. Then, by applying heat to the adhesive layers 51 and 52, bonding between molecules of the adhesive layers 51 and 52 (cross-link curing) is accelerated, and both the adhesive layers 51 and 52 are brought into a cured state. The adhesive layers 51 and 52 are thus combined together to form an adhesive layer 53, with which the piezoelectric vibrator 20 can be hermetically sealed in the space between the recessed portion 31 and the principal surface 11. The adhesive layer 53 is formed to bend along the principal surface 11 and the side face 18 of the substrate 10 to cover the substrate 10. It is thus possible to enhance the adhesive force between the substrate 10 and the adhesive layer 53. The method for forming the adhesive layers 51 and 52 is not limited to that described above in which, during the process where the lid 30 and the substrate 10 are relatively pressed against each other, the adhesive layers 51 and 52 are formed to extend from the principal surface 11 to the side face 18 of the substrate 10 to cover the substrate 10. For example, before the lid 30 and the substrate 10 are relatively pressed against each other, part or all of the adhesive layer 52 may be formed on the side face 18 of the substrate 10 while the adhesive layer 51 is formed on the principal surface 11 of the substrate 10. In this case, the timing of forming the adhesive layer 52 on the side face 18 of the substrate 10 may be either the same as or different from the timing of forming the adhesive layer 51 on the principal surface 11 of the substrate 10. The side face 18 collectively refers to all faces that connect the principal surface 11 to the back surface opposite the principal surface 11, and also includes the side faces of the notched portions 14 and 17. Accordingly, the adhesive layer 53 may cover part or all of the notched portions 14 and 17. The adhesive layer 53 does not necessarily need to be formed to extend from the principal surface 11 to the side face 18 over the entire circumference of the substrate 10, and it is only necessary that the adhesive layer 53 be formed to extend from the principal surface 11 to the side face 18 in part of the substrate 10. For example, the adhesive layer 53 may cover only the notched portions 14 and 17 of the side face 18.

The surface roughness of the side face 18 is preferably rougher than the surface roughness of the principal surface 11. Generally, the contact angle of droplets is known to be sensitive to surface roughness. Here, surface roughness can be defined as the ratio of the area of a rough surface to the area of a flat surface. For example, as surface roughness increases, the contact angle of droplets decreases (i.e., wettability increases) on a lyophilic surface, whereas the contact angle of droplets increases (i.e., wettability decreases) on a lyophobic surface. On the basis of this knowledge, a material for the lid 30 is selected such that the lid 30 is lyophilic to the adhesive layer 52, and at the same time the surface roughness of the side face 18 is made rougher than the surface roughness of the principal surface 11. This can reduce the contact angle of the adhesive layer 52 with respect to the side face 18, and facilitate uniform spreading of the adhesive layer 52. Since this structure allows the adhesive layer 52 to fill the gaps between microscopic asperities on the side face 18, the combined action of the anchoring effect and the Van der Waals force can enhance the adhesive force acting on the interface between the side face 18 and the adhesive layer 52. If the adhesive layer 51 enters the interior of the recessed portion 31, for example, gas emitted from the adhesive layer 51 is adsorbed onto the excitation electrodes 22 and 23 forming a vibrating region of the piezoelectric vibrator 20. Since this may cause variation in the oscillation frequency of the piezoelectric vibrator 20, the adhesive layer 51 is preferably formed not to enter the interior of the recessed portion 31.

To roughen the surface of the side face 18, for example, plasma treatment or sandblasting may be used. Sandblasting is a process which involves sending a blast of compressed air and fine particles (e.g., abrasive particles of alumina or diamond) toward a surface to be processed, and thereby roughening the surface.

Figure 4:
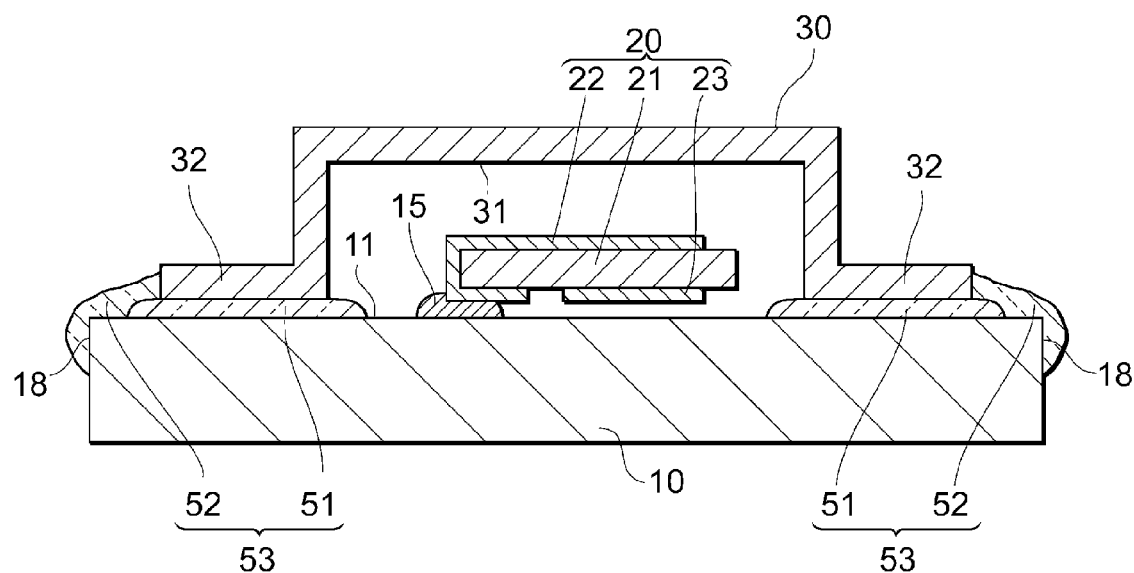
FIG. 4 is another cross-sectional view illustrating the process for manufacturing the piezoelectric vibration component according to the embodiment of the present invention.

In the embodiment described above, the adhesive layer 52 is formed to extend from the principal surface 11 to the side face 18 of the substrate 10. This may be modified, as illustrated in FIG. 4, such that the adhesive layer 52 extends upward along the outer side face of the flange portion 32. The adhesive layer 52 may thus be formed into a fillet in part or all of the outer side face of the flange portion 32. Alternatively, unlike the example illustrated in FIG. 4, the adhesive layer 52 may be formed to spread over the upper surface of the flange portion 32 to cover both the side face and the upper surface of the flange portion 32.

Figure 5:
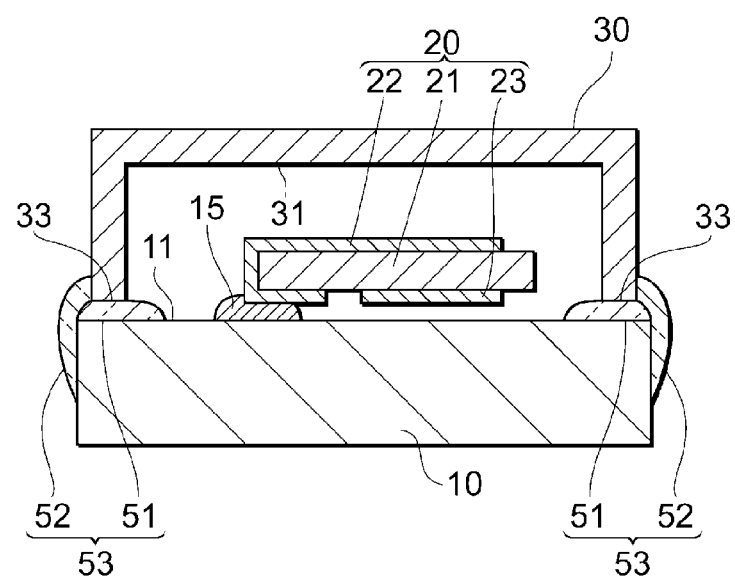
FIG. 5 is another cross-sectional view illustrating the process for manufacturing the piezoelectric vibration component according to the embodiment of the present invention.

Although the lid 30 having the flange portion 32 has been described as an example, the lid 30 does not necessarily need to have the flange portion 32. For example, as illustrated in FIG. 5, the lid 30 may have a frame-like edge portion 33 configured to surround the outer edge of the recessed portion 31 in the shape of a substantially rectangular ring. The edge portion 33 provides a bonding surface which is bonded to the substrate 10, with the adhesive layer 53 interposed therebetween.

The embodiments described above are intended to ease understanding of the present invention, and are not intended to limit the interpretation of the present invention. The present invention can be changed or improved without departing from the spirit thereof and includes equivalents thereof. That is, design changes appropriately made to the embodiments by those skilled in the art are also included in the scope of the present invention as long as they have the features of the present invention. For example, elements of the embodiments and their positions, materials, conditions, shapes, and sizes are not limited to those described above and may be changed appropriately. The elements of the embodiments may be combined as long as such combination is technically possible, and the resulting combinations are also included in the scope of the present invention as long as they include the features of the present invention.

REFERENCE SIGNS LIST

- 10: substrate
- 11: principal surface
- 12: conductive adhesive
- 13: wire
- 14: notched portion
- 15: conductive adhesive
- 16: wire
- 17: notched portion
- 18: side face
- 20: piezoelectric vibrator
- 21: piezoelectric plate
- 22: excitation electrode
- 23: excitation electrode
- 30: lid
- 31: recessed portion
- 32: flange portion
- 33: edge portion
- 40: piezoelectric vibration component
- 51: adhesive layer
- 52: adhesive layer
- 53: adhesive layer

The invention claimed is:

1. A piezoelectric vibration component comprising:
a substrate having a principal surface and a side face, wherein a first surface roughness of the side face is greater than a second surface roughness of the principal surface;
a piezoelectric vibrator;
a lid; and
an adhesive layer bonding the substrate and the lid together so as to hermetically seal the piezoelectric vibrator in a space between the lid and the principal surface of the substrate, the adhesive layer extending from the principal surface to at least a portion of the side face of the substrate.

2. The piezoelectric vibration component according to claim 1, wherein the adhesive layer contains lead-free vanadium glass.

3. The piezoelectric vibration component according to claim 1, wherein the lid includes a recess that defines the space between the lid and the principal surface of the substrate.

4. The piezoelectric vibration component according to claim 3, wherein the lid includes a flange portion that surrounds an outer edge of the lid.

5. The piezoelectric vibration component according to claim 1, wherein the adhesive layer is an insulating adhesive layer.

6. The piezoelectric vibration component according to claim 1, wherein the adhesive layer includes first and second adhesive layers, the first adhesive layer extending on the principal surface of the substrate and the second adhesive layer extending on at least the portion of the side face of the substrate.

7. The piezoelectric vibration component according to claim 6, wherein the second adhesive layer also extends on the principal surface of the substrate.

8. The piezoelectric vibration component according to claim 4, wherein the adhesive layer includes first and second adhesive layers, the first adhesive layer extending on the principal surface of the substrate and between the principal surface and the flange portion of the lid, and the second adhesive layer extending on at least the portion of the side face of the substrate.

9. The piezoelectric vibration component according to claim 8, wherein the second adhesive layer also extends on the principal surface of the substrate.

10. The piezoelectric vibration component according to claim 9, wherein the second adhesive layer also extends on a side surface of the flange portion.

11. The piezoelectric vibration component according to claim 1, wherein a material of the lid is lyophilic relative to the adhesive layer.

12. A method for manufacturing a piezoelectric vibration component, the method comprising:
hermetically sealing a piezoelectric vibrator in a space between a lid and a principal surface of a substrate with an adhesive layer bonding the lid and the substrate together by causing the adhesive layer to extend from the principal surface of the substrate to at least a portion of a side face of the substrate; and
roughening the side face and/or the principal surface such that a first surface roughness of the side face is greater than a second surface roughness of the principal surface.

13. The method for manufacturing a piezoelectric vibration component according to claim 12, further comprising pressing at least one of the lid and the substrate against the other.

14. The method for manufacturing a piezoelectric vibration component according to claim 13, wherein the adhesive layer includes first and second adhesive layers, the first adhesive layer is formed on the principal surface in the shape of a frame so as to surround the piezoelectric vibrator, and the second adhesive layer is formed on at least the portion of the side face of the substrate.

15. The method for manufacturing a piezoelectric vibration component according to claim 14, wherein the second adhesive layer is formed simultaneously with the pressing of the lid and the substrate against each other.

16. The method for manufacturing a piezoelectric vibration component according to claim 12, further comprising curing the adhesive layer.

* * * * *